United States Patent
Tsumura

[19]

[11] Patent Number: 5,918,166

[45] Date of Patent: Jun. 29, 1999

[54] LEVEL CONTROL CIRCUIT FOR PORTABLE RADIO COMMUNICATION APPARATUS

[75] Inventor: Soichi Tsumura, Tokyo, Japan

[73] Assignee: NEC Corportion, Tokyo, Japan

[21] Appl. No.: 08/563,194

[22] Filed: Nov. 27, 1995

[30] Foreign Application Priority Data

Nov. 30, 1994 [JP] Japan .................................... 6-323671

[51] Int. Cl.[6] .................................................. H04B 1/04
[52] U.S. Cl. .................................. 455/249.1; 455/251.1; 455/323; 455/232.1; 455/241.1; 455/253.2
[58] Field of Search .............................. 455/249.1, 250.1, 455/251.1, 323, 126, 125, 232.1, 234.1, 234.2, 235.1, 241.1, 253.2, 205

[56] References Cited

U.S. PATENT DOCUMENTS

| | | | |
|---|---|---|---|
| 4,553,105 | 11/1985 | Sasaki ...................................... | 330/145 |
| 4,665,560 | 5/1987 | Lange ....................................... | 455/249 |
| 5,107,487 | 4/1992 | Vilmur et al. ........................... | 455/127 |
| 5,307,512 | 4/1994 | Mitzlaff ................................... | 455/126 |
| 5,457,811 | 10/1995 | Lemson .................................... | 455/67.1 |
| 5,513,387 | 4/1996 | Saito ....................................... | 455/243.1 |

*Primary Examiner*—Bryan Tung
*Assistant Examiner*—Vu Le
*Attorney, Agent, or Firm*—Laff, Whitesel Conte & Saret, Ltd.

[57] ABSTRACT

A compact level control circuit without using a shield structure is suitably provided in a small space such as a portable radio communication apparatus. A level control circuit for a portable radio communication apparatus arranged by: a first variable attenuator into which an input RF (radio frequency) signal is supplied, the attenuation amount of which is controlled based upon a first level control signal, and which outputs a first attenuated RF signal; a frequency converter for frequency-converting the first attenuated RF signal into a predetermined intermediate frequency band signal to thereby output a first IF (intermediate frequency) signal; a second variable attenuator into which the first IF signal is supplied, the attenuation amount of which is controlled based on the first level control signal, and which outputs a second attenuated IF signal; and a bandpass filter for outputting only said predetermined intermediate frequency band component of the second attenuated IF signal.

2 Claims, 2 Drawing Sheets

LEVEL CONTROL CIRCUIT FOR PORTABLE RADIO COMMUNICATION APPARATUS

BACKGROUND OF THE INVENTION

The present invention generally relates to a level control circuit, and more specifically, to a level control circuit capable of providing a wide-range level control function in a portable radio communication apparatus.

In portable radio communication apparatuses, levels of received radio signals are considerably varied, depending upon the present locations of the portable radio communication apparatuses, and the level variation widths reach to 80 dB. To supply such largely varied radio signals to demodulators within a level of preselected range so as to demodulate information from the received radio signals, a level control circuit capable of controlling a signal level in such a wide range is necessarily required.

In this sort of level control circuit, a variable attenuator is employed. However, since the coupling in a higher frequency band may readily occur in both input and output terminals of the variable attenuator in the radio frequency band and the intermediate frequency band, such a wide-range level control such as 80 dB can be hardly performed only by a single variable attenuator.

As represented in FIG. 1, the Applicants have studied that a required attenuation amount could be achieved by two sets of variable attenuators during the stages to conceive the inventive idea of the present invention. That is, FIG. 1 schematically represents an RF-IF converting unit employed in a receiver unit of a portable radio communication apparatus. The RF-IF converting unit converts an RF signal S1 received by an antenna into an intermediate frequency band signal S2 having a constant average level. This RF-IF converting unit of FIG. 1 is arranged by two sets of variable attenuators 1, 2 cascade-connected to each other, the respective attenuation amounts of which are controlled in response to a commonly used level control signal C1; a converter 3 for converting a level-controlled RF signal derived from these variable attenuators 1, 2 into an intermediate frequency (IF) band signal; and a bandpass filter 4 for extracting a desired intermediate frequency band signal S2 from the output signal of the converter 3.

With this circuit arrangement, the level control could be achieved in a wider range than that achieved by a single variable attenuator. However, another problem of the coupling in a higher frequency band is newly produced between the respective variable attenuators. Thus, each of these variable attenuators should be made in a shield structure.

Nevertheless when such a shield structure is employed, the resulting radio communication apparatus would become bulky, which could not satisfy a need to make a compact portable type radio communication apparatus.

Although the above-described coupling in a higher frequency band via a space between the respective variable attenuators can be prevented by employing the shield structure, another coupling via a level control signal line between them could not be prevented.

SUMMARY OF THE INVENTION

Accordingly, an object of the present invention is to provide a compact level control circuit capable of achieving a level control over a wide range without employing a specific shield structure.

In accordance with one aspect of the present invention, there is provided a level control circuit for a portable radio communication apparatus, comprising:

a first variable attenuator into which an input RF (radio frequency) signal is supplied, the attenuation amount of which is controlled based upon a first level control signal, and which outputs a first attenuated RF signal;

a frequency converter for frequency-converting the first attenuated RF signal into a predetermined intermediate frequency band signal to thereby output a first IF (intermediate frequency) signal;

a second variable attenuator into which the first IF signal is supplied, the attenuation amount of which is controlled based on the first level control signal, and which outputs a second attenuated IF signal; and a bandpass filter for outputting only said predetermined intermediate frequency band component of the second attenuated IF signal.

DETAILED DESCRIPTION OF THE PREFERRED EMBODIMENTS

Referring now to drawings, various preferred embodiments of the present invention will be described.

Figure 1:
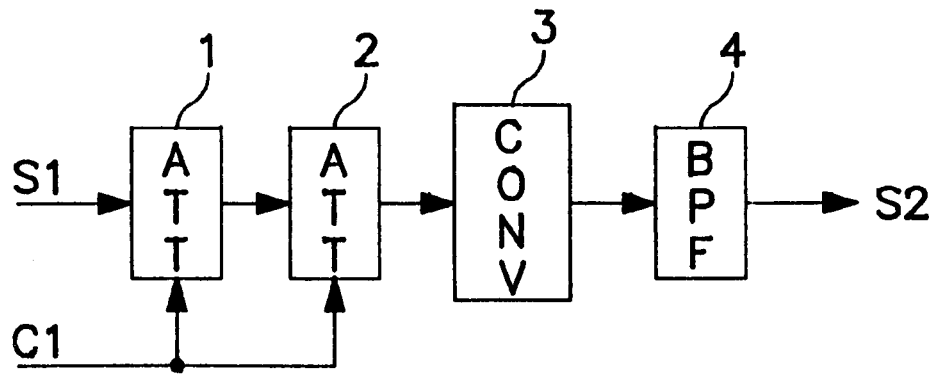
FIG. 1 is a block diagram for explaining one level control circuit constructed in accordance with the background art of the present invention.
Figure 2:
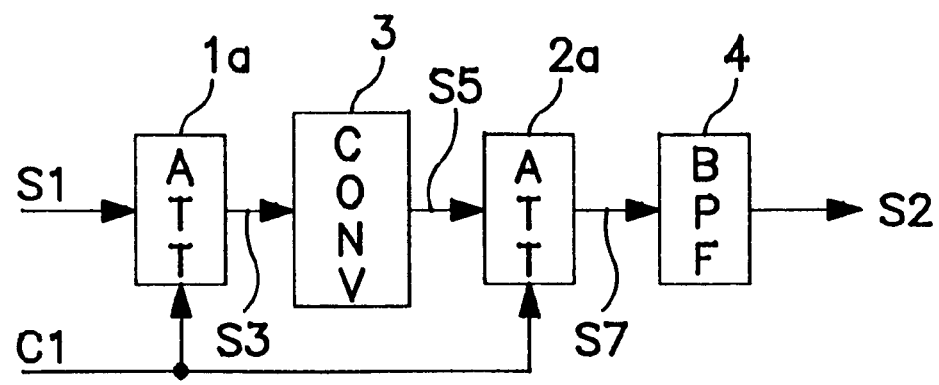
FIG. 2 is a block diagram for explaining a level control circuit according to a first embodiment of the present invention.

FIG. 2 is a schematic block diagram for showing a level control circuit according to a first embodiment of the present invention.

As illustrated in FIG. 2, the level control circuit of the first embodiment is comprised of:

a first variable attenuator (1a) into which an input RF (radio frequency) signal (S1) is supplied, the attenuation amount of which is controlled based upon a first level control signal (C1), and which outputs a first attenuated RF signal (S3);

a frequency converter (3) for frequency-converting the first attenuated RF signal (S3) into a predetermined intermediate frequency band signal to thereby output a first IF (intermediate frequency) signal (S4);

a second variable attenuator (2a) into which the first IF signal (S4) is supplied, the attenuation amount of which is controlled based on the first level control signal (C1), and which outputs a second attenuated IF signal (S5); and a bandpass filter (4) for outputting only said predetermined intermediate frequency band component of the second attenuated IF signal.

The attenuation amounts of these attenuators 1a and 2a are controlled in response to the control signal C1 transmitted from a CPU and the like (not shown). For instance, the CPU monitors the level of the output signal S2 derived from the bandpass filter 4 and controls the attenuation ratios of the attenuators 1a, 2a in such a manner that the monitored signal level becomes constant.

Next, operations of the level control circuit according to this embodiment will be explained.

When an input RF (radio frequency) signal S1 is entered into the attenuator 1a, the power of the input RF signal S1 is attenuated by the attenuator 1a, and the attenuated signal is supplied to the frequency converter 3 as a first attenuated RF signal S3.

Then, the frequency of the first attenuated RF signal S3 is converted into an intermediate frequency by the frequency converter 3, and the frequency-converted signal is supplied as a first intermediate frequency (IF) signal S5 into the attenuator 2a.

The first intermediate frequency signal S5 is furthermore attenuated by this attenuator 2a, and the attenuated signal is inputted into the bandpass filter 4 as a first attenuated IF signal S7. The first attenuated IF signal S7 is filtered out by this bandpass filter 4, and thereafter the filtered IF signal is outputted as an intermediate frequency band signal S2.

As described above, the input RF signal is converted into the IF signal and is attenuated. Either the input RF signal S1, or the first attenuated RF signal S3 becomes electromagnetic waves. Then, the electromagnetic waves are entered into the first attenuated RF signal S7, otherwise flow via a control line of the control signal C1 into the attenuator 2a, so that a path is formed between the attenuators 1a and 2a, and these attenuators 1a and 2a are brought into coupling conditions. As a result, such a fact may occur, in which these signals are mixed with the first attenuated signal S7 outputted from the attenuator 2a.

However, the bandpass filter 4 may pass only the frequency component of the first intermediate frequency signal S5 frequency-converted by the frequency converter 3, namely, the bandpass filter 4 may pass only the first attenuated IF signal S7 having the intermediate frequency. As a consequence, since the frequency component of the signal mixed with the first attenuated IF signal S7 via the above-described signal path is different from the frequency of the first attenuated IF signal S7, only the first attenuated IF signal S4 is outputted as the output signal S2 from the bandpass filter 4.

As described above, in accordance with the level control circuit of the first embodiment, since no care should be taken into the coupling between the attenuators 1a and 2a, the respective attenuators need not be constructed with the shield structure. Moreover, since the desirable level control can be done over a wide range with having a simple structure, the level control circuit according to the first embodiment may be packaged even in a small space such as a mobile communication apparatus.

Figure 3:
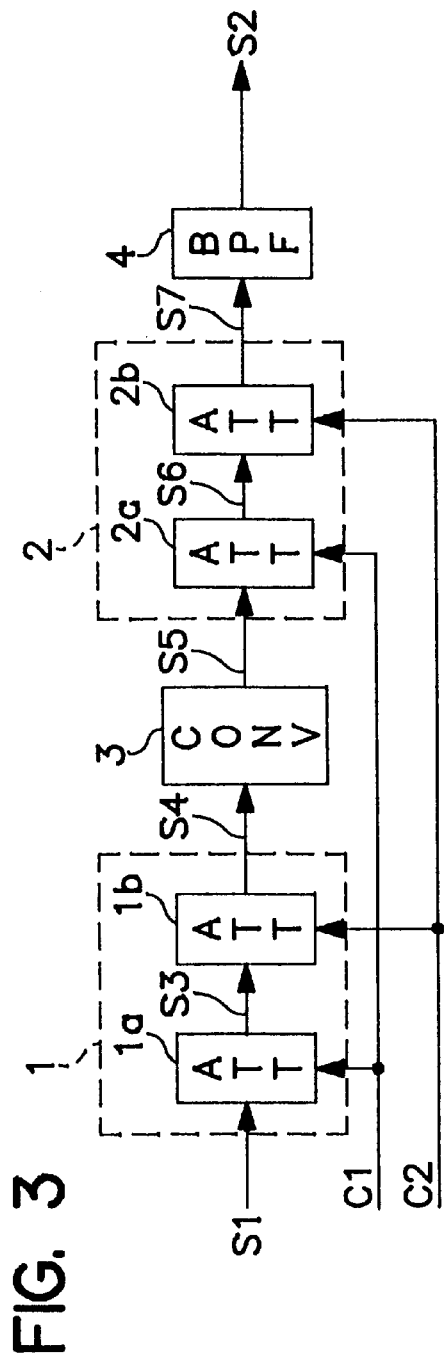
FIG. 3 is a block diagram for explaining a level control circuit according to a second embodiment of the present invention.

FIG. 3 is a schematic block diagram for representing a level control circuit according to a second embodiment of the present invention.

The level control circuit according to the second embodiment is so arranged that a third attenuator 1b is interposed between the first attenuator 1a and the frequency converter 3 of the first embodiment, a fourth attenuator 2b between the second attenuator 2a and the filter 4, and attenuation amounts of the third and fourth attenuators 1b, 2b are controlled in response to a second control signal C2.

With the above-described circuit arrangement, the input RF signal S1 is sequentially attenuated by four sets of attenuators 1a, 1b, 2a, 2b, so that the level control can be performed within a wider range than that of the level control circuit according to the first embodiment. That is, the level control range of the second embodiment is approximately two times or wider than that of the first embodiment.

Since one paired attenuators 1a and 2a are operable in the different frequency range from that of the other paired attenuators 1b and 2b, and also are controlled by the different control signals C1 and C2, even when the input RF signal is propagated through the conducting line for connecting the paired attenuators 1a, 2a, (1b, 2b) to be mixed with the output signal derived from these paired attenuators 1a, 2a (1b, 2b), the mixed signal component can be easily removed by the bandpass filter 4.

It should be noted that since other circuit arrangements and effects of the second embodiment are similar to those of the first embodiment, no further explanations thereof are made in this specification.

Figure 4:
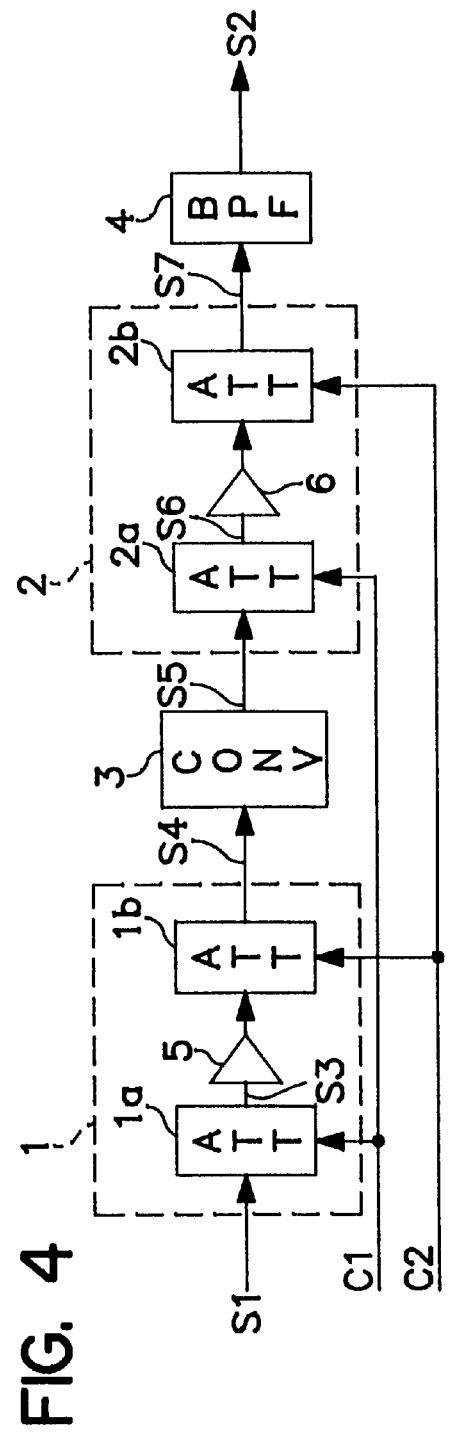
FIG. 4 is a block diagram for explaining a level control circuit according to a third embodiment of the present invention.

FIG. 4 is a schematic block diagram for representing a level control circuit according to a third embodiment of the present invention.

The level control circuit of the third embodiment is so constructed that an amplifier 5 is interposed between the attenuators 1a and 1b of the second embodiment, and another amplifier 6 is interposed between the attenuators 2a and 2b.

With the above-explained circuit arrangement, the RF band signal is amplified by the amplifier 5, and the IF band signal is amplified by the amplifier 6, so that the bandpass filter 4 outputs the filtered signal as an output signal S2 having a desired gain.

In other words, to give a desired gain to the output signal S2 in the above-described second embodiment, an amplifier must be provided on the output side of the bandpass filter 4. However, the signal is merely attenuated by the attenuators 1a, 1b, 2a, 2b. As a consequence, the level of the filter output signal S2 derived from the bandpass filter 4 is considerably lowered. Thus, there is such a risk that even if the filter output signal S2 is amplified by an amplifier employed on the filter output side, the considerably lowered level of the filter output signal S2 can be hardly detected.

To the contrary, as described in the third embodiment, the levels of the RF/IF signals are slightly amplified by employing the amplifiers 5 and 6 before the levels of the signals are considerably lowered. Accordingly, the output signal S2 having a desired gain can be obtained from the bandpass filter 4 of the level control circuit according to the third embodiment.

Furthermore, since the amplifier 5 is interposed between the attenuators 1a and 1 b and the amplifier 6 is interposed between the attenuators 2a and 2b, the above-explained couplings occurred between the one paired attenuators 1a and 1b, and also between the other paired attenuators 2a and 2b are weakened, so that the unwanted signal components are no longer mixed with the filter output signal S2.

It should be noted that since other circuit arrangements and effects of the third embodiment are similar to those of the second embodiment, no further explanations thereof are made in this specification.

As previously explained in detail, in accordance with the level control circuits of the present invention, even when the signal having the frequency before frequency-converted by the frequency converter is mixed with the attenuated signal, this signal having such a frequency can be removed by the filter. Therefore, no care should be taken into the couplings among the attenuators, and a desirable wide-range level control can be performed with employment of a simple structure. As a result, the level control circuit according to the present invention can be packaged into such a small space as in a mobile communication apparatus.

According to the level control circuit of the second embodiment, after the signal has been sequentially attenuated by a plurality of subdivided attenuators, only the signal having the frequency-converted by the frequency converter is filtered by the bandpass filter to be outputted. Therefore, there is an advantage that the level control wider than that of the first embodiment can be achieved.

Also, according to the level control circuit of the third embodiment, since the signal is sequentially amplified by the amplifiers interposed between the subdivided attenuators, there is another advantage that the filter output signal having the desired gain can be produced.

In the above, the invention is explained by first-to-third embodiments in which an RF signal is converted to an IF signal. However, the invention is applied not only to level control circuits in which an RF signal is converted to an IF signal but also to those in which an IF signal is converted to an RF signal. In these alternative embodiments, for example, the IF signal is inputted thereto as signals (S1) of FIGS. 2–4 and the frequency converters of FIGS. 2–4 converts an inputted IF signal to a RF band signal.

Although the present invention has been described in connection with various preferred embodiments thereof, it will be appreciated that these embodiments are provided solely for purpose of illustration, and should not be construed as limiting the scope of the invention. Other embodiments and applications of the invention will be readily apparent to those skilled in the art from reading the present specification and practicing the techniques herein, without departing whatsoever from the scope and sprit of the appended claims.

What is claimed is:

1. A level control circuit for a portable radio communication apparatus comprising:

a first variable attenuator into which an input signal of a first frequency band is supplied, said input signal being attenuated based on a first level control signal to output a first attenuated signal;

a frequency converter for frequency-converting the first attenuated signal into a signal of a second frequency band to thereby output a second signal;

a second variable attenuator into which the second signal is supplied, the second signal being attenuated based on the first level control signal to output a second attenuated signal:

A bandpass filter for outputting only frequency components of said second frequency band of the second attenuated signal;

a third attenuator interposed between said first variable attenuator and said frequency converter, the attenuation amount of which is controlled in response to a second level control signal, said first attenuated signal being supplied thereto from said first variable attenuator and a third attenuated signal being outputted therefrom to said frequency converter; and a fourth variable attenuator interposed between said second variable attenuator and said bandpass filter, the second attenuated signal being attenuated in response to said second level control signal, said second attenuated signal being supplied thereto from said second variable attenuator and a fourth attenuated signal being outputted therefrom to said bandpass filter.

2. A level control circuit for a portable radio communication apparatus as claimed in claim 1 wherein:

said level control circuit further comprises:

a first amplifier interposed between said first variable attenuator and said third variable attenuator, for amplifying said first attenuated signal supplied from said first variable attenuator to thereby output the amplified first attenuated signal to said third variable attenuator; and a second amplifier interposed between said second variable attenuator and said fourth variable attenuator, for amplifying said second attenuated signal supplied from said second variable attenuator to thereby output an amplified second attenuated signal to said fourth variable attenuator.

* * * * *